(12) United States Patent
Oesterholt

(10) Patent No.: US 7,374,957 B2
(45) Date of Patent: May 20, 2008

(54) METHOD OF CALIBRATING OR QUALIFYING A LITHOGRAPHIC APPARATUS OR PART THEREOF, AND DEVICE MANUFACTURING METHOD

(75) Inventor: Rene Oesterholt, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 321 days.

(21) Appl. No.: 11/177,491

(22) Filed: Jul. 11, 2005

(65) Prior Publication Data

US 2007/0009814 A1    Jan. 11, 2007

(51) Int. Cl.
*G01R 31/26* (2006.01)
(52) U.S. Cl. ..................... 438/14; 438/15; 438/16; 438/17; 438/18
(58) Field of Classification Search ............. 438/6, 438/10, 104, 107–118, 121–123, 128–129, 438/135, 142, 145, 149, 151, 157, 176, 478, 438/184, 193, 195–198, 200–203, 206, 207, 438/209–211, 218, 237, 165, 248, 268, 343, 438/294, 308, 337, 353, 378, 401, 410, 5, 438/7, 11, 14, 16, 17, 18, 22–24, 29, 31, 34–36, 438/130, 484, 538; 257/797, E21.206
See application file for complete search history.

(56) References Cited

U.S. PATENT DOCUMENTS

| 4,439,221 A * | 3/1984 | Smyth et al. ................. 65/378 |
| 2005/0006740 A1* | 1/2005 | Letertre et al. .............. 257/678 |
| 2005/0009213 A1* | 1/2005 | Wang et al. .................. 438/5 |
| 2006/0073686 A1* | 4/2006 | Zach et al. ................. 438/551 |

OTHER PUBLICATIONS

Ross, Stephen M., Journal of Engineering Technology, Peirce's Criterion for the Elimination of Suspect Experimental Data, Fall 2003, 4 pages.

* cited by examiner

*Primary Examiner*—Kiesha Rose
*Assistant Examiner*—Chakila D Tillie
(74) *Attorney, Agent, or Firm*—Pillsbury Winthrop Shaw Pittman LLP

(57) ABSTRACT

A system and method are provided for qualifying or calibrating lithographic apparatus or parts therefor, using a predetermined objective criterion such as Chauvenet's criterion is used to reject measurement points, individually, by field or by substrate.

25 Claims, 6 Drawing Sheets

METHOD OF CALIBRATING OR QUALIFYING A LITHOGRAPHIC APPARATUS OR PART THEREOF, AND DEVICE MANUFACTURING METHOD

FIELD

The present invention relates to a method of calibrating or qualifying a lithographic apparatus or part thereof and to a device manufacturing method using the calibrated or qualified apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

As lithographic apparatus are used to manufacture devices with ever smaller critical dimension (CD), i.e. the dimension of a feature or features in lithography shrinks, variations will cause undesirable variation in physical properties of the feature, such as the gate width of a transistor. Calibration and qualification of the apparatus become increasingly important to ensure consistent results and high yield.

Many different parameters of a lithographic apparatus must be measured for calibration and/or qualification of an apparatus or part of an apparatus and in many cases a large number of measurements must be taken to get a suitably accurate and precise measurement of a given parameter. An example is the flatness of the substrate holder (also referred to as the pimple plate or exposure chuck). The substrate holder comprises a flat disc of low-CTE material corresponding in size to a substrate and having on both sides a large number of small projections whose extremities should lie in respective common planes. For an exposure the substrate holder rests on the projections of one side on the substrate table and the substrate rests on the projections of the other side. The spaces between substrate and holder and table and holder are evacuated to clamp the substrate in place. If there is any distortion of the substrate holder or deviation in the height of the projections, the substrate will be distorted in turn, leading to focus spots overlay errors and reduced yield. It is therefore necessary to ensure that the substrate holder is sufficiently flat before use. However, because the projections are small and large in number it is difficult to measure directly whether their ends lie in the correct flat plane.

Conventionally, the flatness of a substrate holder has been determined by placing it in a lithographic apparatus, placing a test substrate on top and measuring the height and/or local tilt of the top surface of the substrate at a large number of positions, e.g. 8,000 to 9,000 for a 200 mm substrate. This is then repeated for ten or more test substrates and statistical methods are used to determine from the resulting data the flatness of the substrate holder, separating out the contribution from the unflatness of the test substrates. However, it has been found that this method can reject substrate holders that do in fact meet qualification requirements, which is wasteful as the substrate holders are difficult and hence expensive to manufacture.

Another example of a calibration and/or qualification method using a large number of test measurements, often over several test wafers is the calibration and/or qualification of an apparatus' overall overlay (X,Y) and focus (Z) performance. Since this takes into account all intrinsic and extrinsic factors that may affect performance of the apparatus, the repeatability of the results is poor.

SUMMARY

It is desirable to provide improved methods for calibrating and/or qualifying lithographic apparatus and/or parts thereof.

According to an aspect of the invention, there is provided a method of calibrating a lithographic apparatus, the method comprising:

measuring a value of a parameter indicative of the performance of the lithographic apparatus at a plurality of different (i) positions, (ii) times (iii) settings, or any combination of (i)-(iii) of the apparatus to generate a first data set comprising a plurality of measurement values;

generating a second data set that is a subset of the first data set using a predetermined criteria to select data values of said first data set for inclusion in said second data set; and using a predetermined statistical process to derive a calibration value from the second data set.

According to an aspect of the invention, there is provided a device manufacturing method using a lithographic apparatus arranged to transfer a pattern from a patterning device onto a substrate, the method comprising:

calibrating the lithographic apparatus by:

measuring a value of a parameter indicative of a performance of the lithographic apparatus at a plurality of different (i) positions, (ii) times, (iii) settings, or any combination of (i)-(iii) of the apparatus to generate a first data set comprising a plurality of measurement values;

generating a second data set that is a subset of the first data set using a predetermined criteria to select data values of said first data set for inclusion in said second data set; and using a predetermined statistical process to derive a calibration value from the second data set; and transferring a device pattern onto a second substrate using the calibration value to adjust a parameter of the apparatus.

According to an aspect of the invention, there is provided a method of qualifying a part for a lithographic apparatus, the method comprising:

measuring a value of a parameter indicative of a desired quality of the part at a plurality of different (i) positions, (ii) times, or a combination of (i) and (ii) to generate a first data set comprising a plurality of measurement values;

generating a second data set that is a subset of the first data set using a predetermined criteria to select data values of said first data set for inclusion in said second data set; and using a predetermined statistical process to derive a qualification value from the second data set, whereby the fitness for use of the part can be judged on the basis of the qualification value.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
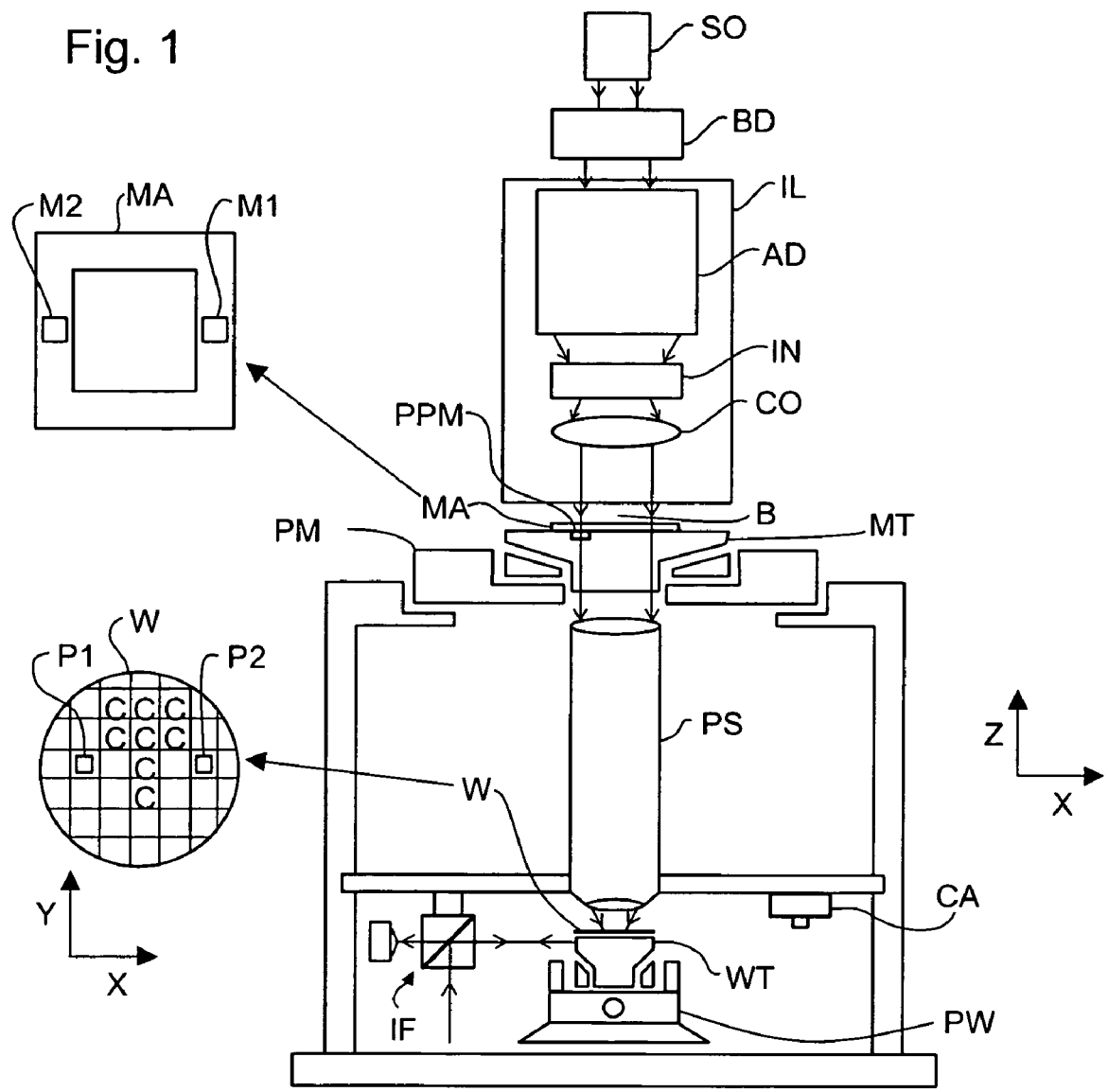
FIG. 1 depicts a lithographic apparatus according to an embodiment of the invention.

FIG. 1 schematically depicts a lithographic apparatus used in one embodiment of the invention. The apparatus comprises:

- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As mentioned above, the flatness of the substrate holder is an important factor contributing to the yield of a lithographic apparatus. Before use, a substrate holder must therefore be subject to a qualification process to determine whether it complies with relevant specifications.

Figure 2:
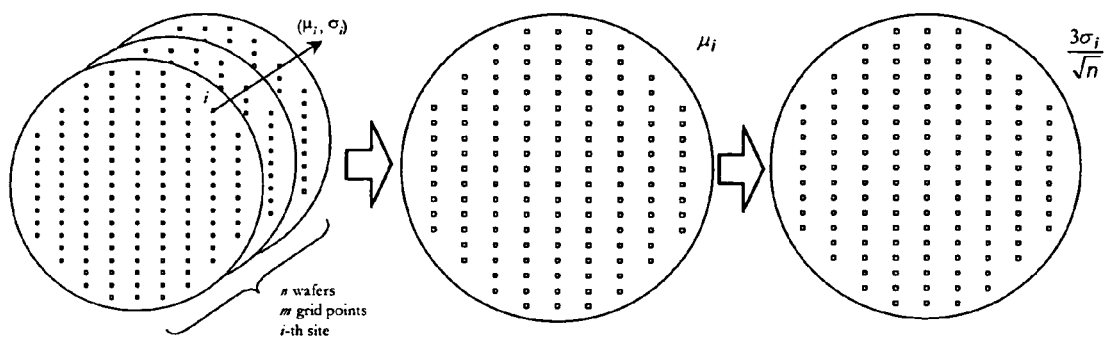
FIG. 2 depicts a measurement technique for substrate holder qualification.

A measurement technique for substrate holder (also referred to as the exposure chuck or E-chuck) flatness qualification is based on the measurement of multiple test wafers, where each test wafer is measured several times at different positions relative to the underlying substrate holder. A calculation model is used to obtain a reliable estimate of the chuck flatness after mathematical elimination of the wafer flatness contribution. The result is a so-called modeled height map per wafer which consists of m grid points for each of n wafers, as shown in the left hand side of FIG. 2. To obtain the best estimate of the substrate holder flatness, the average height map, consisting of a grid of m values as shown in the middle of FIG. 2, is calculated from the individual wafer modeling results. The average height map is input for the substrate holder qualification model which is applied to determine the topside flatness of the substrate holder in terms of several parameters, including local flatness (SFSD, SFQD), local tilt (Rx, Ry) and edge roll-off.

FIG. 2 illustrates the calculation of the average height map and the estimated error in this map, on each position of the measurement grid. Note that the same principle can be applied to the derived qualification parameters. The measurement grid contains typically 8000-9000 points (m), with a measurement pitch in X and Y direction that is in the order of 1-3 millimeters. Each point of the qualification grid i is characterized by the mean value $\mu_i$ and the standard deviation $\sigma_i$ determined over n measurements, i.e. wafers. To assess the quality of the test performance result the estimated error in the mean $\mu_i$ is calculated. This error, defined in each valid point of the qualification grid, is assumed to scale with $\sigma_i/\sqrt{n}$. By definition it can be represented by $3 \cdot \sigma_i/\sqrt{n}$.

In an embodiment of the invention, a mechanism based on applying a statistically objective method with a norm based on the number of measurements n (wafers) in the set is used to reject measurement outliers. In a series of n measurements, one or more measurements may occur with a deviation much larger than the standard deviation σ. These outliers will influence the average value p and the variance of the n measurements. One method of data rejection is to apply Chauvenet's criterion. This statistical criterion for data rejection states that:

'a particular measurement from a series of n measurements is rejected if the probability of occurrence for its deviation from the mean is smaller than ½n'.

The distribution is assumed to be standard normal. Let the deviation $d_c$ represent the distance of a certain (suspected) measurement with respect to the mean μ. To apply Chauvenet's criterion, one has to relate the deviation $d_c$ of a measurement to the probability of occurrence $p_c$ for such deviation. The 'eccentricity' $e_c$ represents the normalized deviation of a certain (suspected) measurement, $e_c = d_c/\sigma$, which merely represents the absolute value of the standardized Z score. Table 1 below lists a number of values for the eccentricity $e_c$ as a function of the number of measurements n. These values can be obtained by looking up the values in the Z score table of the standard normal distribution, when considering the probability of occurrence $p_c$ for an eccentricity e, taken absolute, larger than $e_c$. The measurement i may be rejected when $p_c < ½n$ and accordingly $e_i > e_c$.

This results in a third data set DS3 which contains only the reliable wafer points. Thus, there are less than m points each for some or all of the n test wafers but the missing points should not be the same in each wafer. If too many measurements are rejected, all measurements are repeated.

In a second, optional phase a rejection criteria can be applied (step S5) across whole substrates. For example, complete substrates can be rejected by assessing the remaining valid qualification area per wafer and by applying Chauvenet's criterion again. This means that complete substrates whose invalid area is too large are rejected automatically to generate a fourth data set DS4 comprising data for less than n substrates. In this case the following methodology is applied:

Calculate the percentage [%] of valid qualification area per substrate j. This area is determined by reference to the data points excluded in step S4.

Exclude the substrate(s) that are non-conforming, using the same statistical criterion as before but applied to a different parameter: the percentage of valid area.

Where the unflatness map includes multiple parameters per data point, this approach can be applied in two different ways. The first option is to optimize the average height map and to recalculate the derived performance parameters. The

TABLE 1

Values of eccentricity $e_c$ (statistical norm) on the basis of which a measurement i with an eccentricity $e_i$ larger than $e_c$ may be rejected, as a function of the number of measurements n.

| n | | | | | | | | | | | |
|---|---|---|---|---|---|---|---|---|---|---|---|
| | 5 | 6 | 7 | 8 | 9 | 10 | 12 | 14 | 16 | 30 | 44 |
| $e_c$ | 1.65 | 1.73 | 1.81 | 1.86 | 1.91 | 1.96 | 2.04 | 2.10 | 2.15 | 2.39 | 2.53 |

Alternative criteria, such as Peirce's Criterion may be used. Another alternative is to apply absolute norms for measurement data rejection based on considerations other than solely statistics. Absolute norms may be derived based on known or expected error contributions. For example, norms for test quality could be derived based on a test budget analysis, after identification of the relevant parameters that influence the test quality in a (more or less) predictable way, that can be estimated quantitatively, beforehand.

Figure 3:
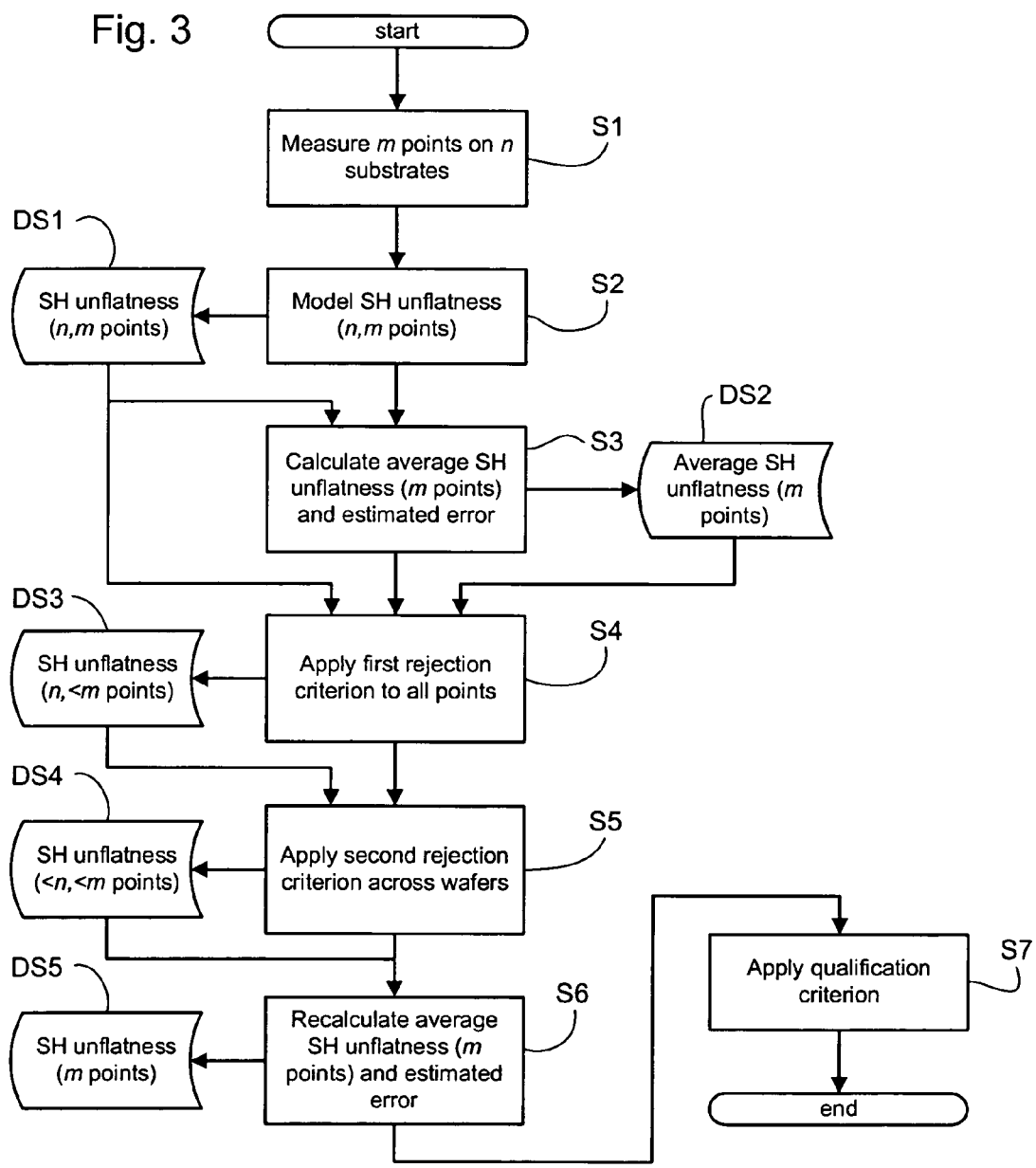
FIG. 3 is a flow chart of an embodiment of the invention

In an embodiment of the invention, shown in FIG. 3, measurements of m points on n substrates are taken, step S1, then processed to model the substrate handler unflatness in step S2, giving a first data set DS1 comprising (n,m) data points. Each data point may comprise values for some or all of local unflatness, local tilt in two dimensions and height. This data set is then processed in step S3 using standard statistical techniques to derive the average substrate holder unflatness and estimated error which are stored as a second data set DS2. In step S4, the above described statistical criterion is applied automatically to each individual point i of the 2-dimensional qualification grid to reject non-conforming (suspected) measurements from particular wafers. In more detail:

First, the eccentricity $e_{ij}$ is calculated for each specific wafer j in each grid point i.

Then, Chauvenet's criterion is applied to reject individual wafer points in the areas of large variability with an eccentricity exceeding the objective statistical norm, $e_{i,j} > e_c$.

second option is to optimize separately the average performance map for each derived parameter, and then recalculate the new mean and new standard deviation and/or error.

Based on the exclusion of specific measurements per substrate, the new mean and new standard deviation (and error) are calculated in step S6 in each grid point to characterize the new—filtered—qualification map which forms a fifth data set DS5. The overall qualification requirements for the substrate holder can now be applied in step S7 to the filtered qualification map. This avoids incorrect rejections of good substrate holders because of measurement errors.

Figure 4:
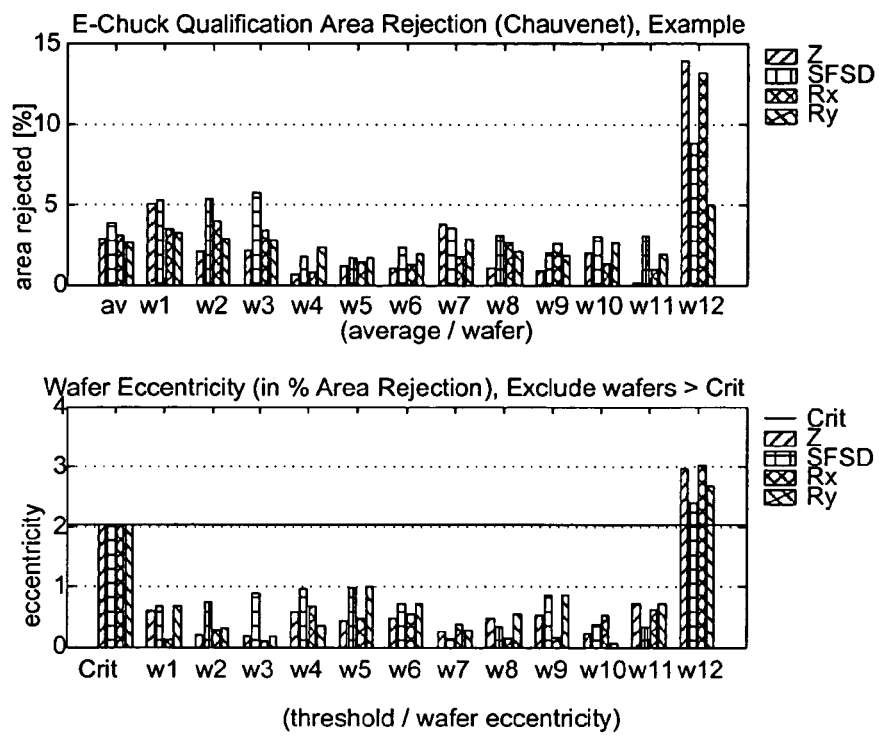
FIG. 4 shows measurement rejection in a sample set of data used as an example of the invention.

By way of an example, FIG. 4 shows a set of experimental data to which the complete substrate rejection process is applied. In the upper chart of FIG. 4, for each of four parameters (height—Z, local unflatness—SFSD, and local tilts—Rx, Ry) the percentage area of each wafer for which measurements have been rejected in the first phase is shown. As can be seen, the percentage rejected is about or considerably less than 5% for all parameters for wafers 1 to 11 but is considerably higher for all parameters for wafer 12. The lower chart in the figure shows the eccentricity e for each parameter for each wafer and a critical threshold, indicated as "Crit" in the Figure but equal to $e_c$ as defined above, which is derived as described above from the number of measurements (wafers) in the set. The original number of wafers in the dataset is n=12, resulting in a rejection norm of $e_c = 2.04$. It can clearly be seen that the eccentricity for wafer 12 is above the threshold for all parameters. Hence the measurements for wafer 12 are rejected.

In a variation of the embodiment, the rejection of outlier measurement data can be applied to fields, rather than complete substrates. Thus the statistically objective method is applied with a norm based on the number of measurements n (fields) in the set. (These fields may be exposed on a single substrate or on multiple substrates.) In a series of n measurements, one or more measurements may occur with a deviation much larger than the standard deviation σ. These outliers will influence the average value u and the variance of the n measurements. In more detail, the above described statistical criterion is applied to each individual point i of the qualification field as follows:

First, the eccentricity $e_{ij}$ is calculated for each specific field j in each field point i.

Then, Chauvenet's criterion is applied to reject individual field points in the areas of large variability with an eccentricity exceeding the objective statistical norm, $e_{i,j} > e_c$.

Based on the exclusion of specific measurements per wafer (in specific fields), the new mean and new standard deviation (and error) are calculated in each field point to characterize the new—filtered—qualification field map.

This approach allows optimization of the average field map (e.g. the invariant pattern of non-correctable errors related to lens and reticle distortion) and to recalculate derived performance parameters (e.g. the estimated measurement noise).

Again, in an optional second phase, complete fields can be rejected by assessing the remaining valid qualification area per field and by applying Chauvenet's criterion again. This means that complete fields with a too large invalid area are rejected automatically. In this case the following methodology is applied:

Calculate the percentage [%] of valid qualification area per field j. This area is determined by the exclusion of measurements per field as described above.

Exclude the field(s) that are non-conforming, based on using the same statistical criterion but applied to a different parameter: the percentage of valid area, $e_j > e_c$.

After excluding the non-conforming field(s), recalculate the new mean and new standard deviation (and error) in each field point to characterize the new—filtered—qualification map.

Figure 5:
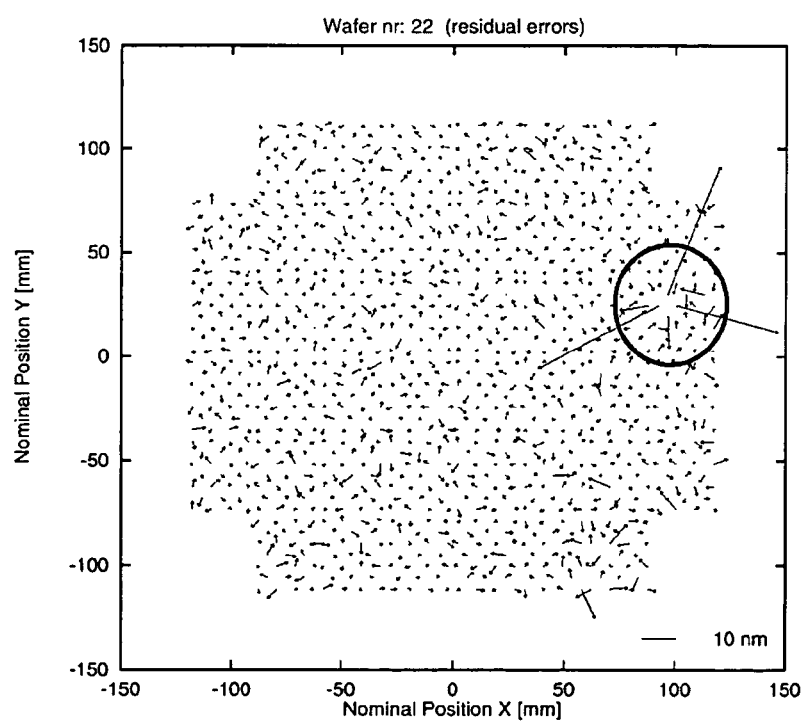
FIG. 5 is a plot of overlay residual error data used in an example of the invention.

FIG. 5 shows some overlay measurement data from which is used as an example to illustrate the field-based methods of automatic data rejection. Specifically, FIG. 5 shows a vector plot of overlay measurement data with a clear spot (indicated). Shown are the residual errors, i.e. the non-correctable errors obtained after removing systematic errors. This plot represents substrate number 22, which has been selected from a batch of 25 wafers. The original number of fields on this substrate n=44, resulting in a rejection norm of $e_c$=2.53 (Table 1). The number of points per field is 25.

Figure 6:
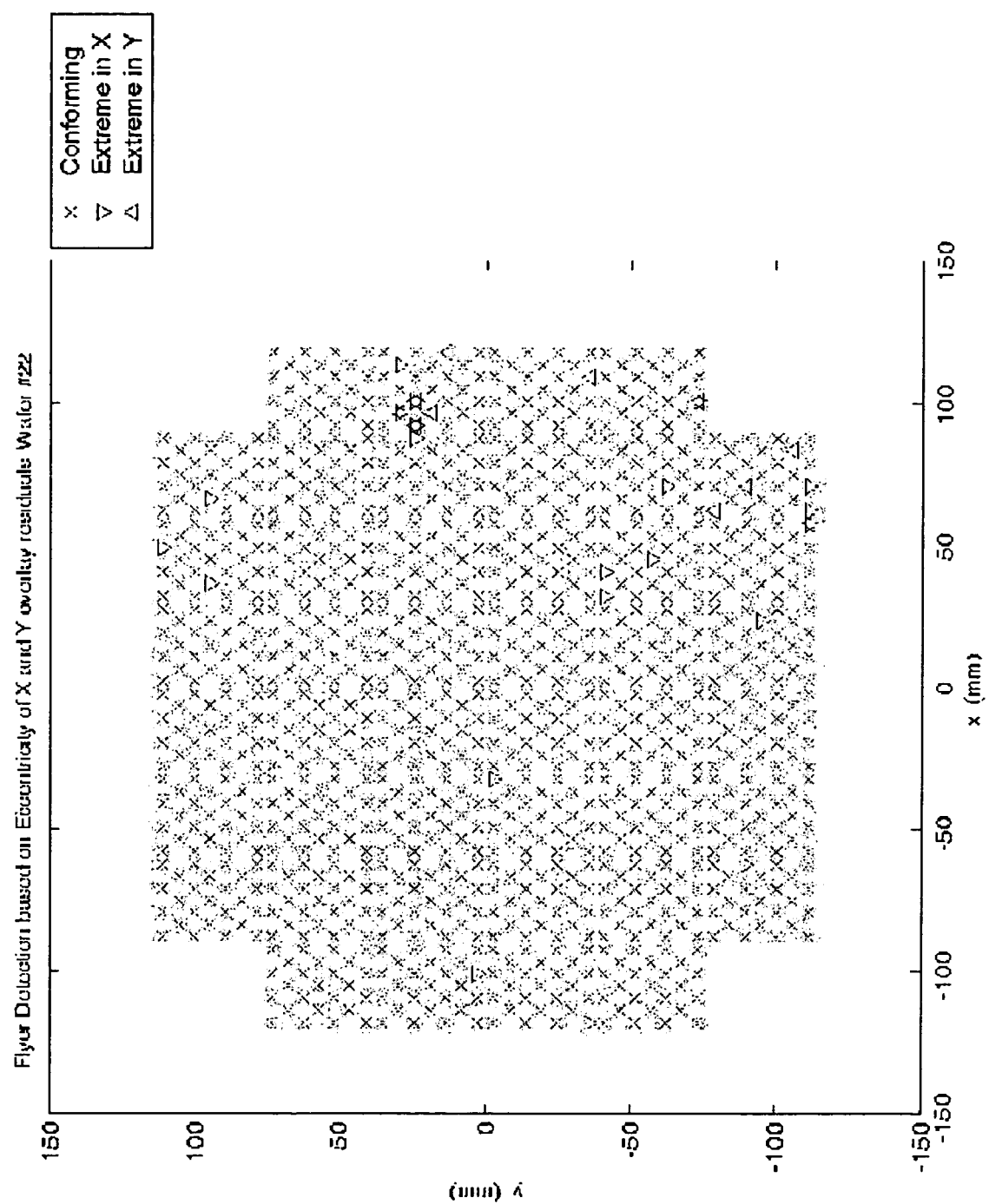
FIG. 6 illustrates rejected measurements in the data example of FIG. 5.

The analysis starts with calculating the eccentricity for each point on the wafer and by rejecting the measurements with an eccentricity exceeding the norm. FIG. 6 shows the spatial distribution of the X and Y data points that are rejected. Deviating data points with $e_{i,j} > e_c (=2.53)$ are marked with triangles for X and Y. All data conforming the criterion is marked with crosses. By comparing FIGS. 5 and 6, it can be seen that data points are rejected in areas corresponding to large overlay values and especially the ringed field in FIG. 5. Note that the FIGS. 5 and 6 show 44 fields numbered left to right in the bottom row, right to left in the second row, left to right in the third row, etc.

In this example, the maximum number of rejected measurements on a certain field position i is 2, see Table 2. This means that the average on that position will be recalculated based on 42 valid measurements instead of the original 44. For the residual errors in X and Y, this occurs on respectively 4 and 1 out of 25 points of the field. Respectively 13 points (X) and 9 points (Y) of the average field may be qualified based on the measurement data from 43 fields, and 8 points (X) and 15 points (Y) may be qualified based on the original measurement set of n=44 fields. This means that this measurement has a better quality in Y compared to X. If we recalculate the average non-correctable fingerprint, respectively 32% (X) and 60% (Y) will be based on the original set of n=44 fields.

TABLE 2

Reduced site sampling after outlier rejection based partial field exclusion

| Number of measurements | Residual error in X | | Residual error in Y | |
| --- | --- | --- | --- | --- |
| n | points | area | points | area |
| 42 | 4 | 16% | 1 | 4% |
| 43 | 13 | 52% | 9 | 36% |
| 44 | 8 | 32% | 15 | 60% |
| Field total | 25 | 100% | 25 | 100% |

There are now three ways to proceed. The average non-correctable fingerprint and the measurement noise can be calculated by either:

single point (partial field) exclusion (maintaining all fields, but with partial exclusion from specific points in specific fields), or field exclusion (only fields with too many outliers are excluded completely), or a combination of single point and field exclusion.

This is illustrated with reference to FIG. 7 which in its upper part shows the rejected area per field for the residuals in X and Y, and the average (dotted lines) calculated over all fields. The lower part shows the field eccentricity $e_j$, applying Chauvenet's criterion to the valid area [%]. The threshold $e_c$ is 2.53 indicated by the black line.

Figure 7:
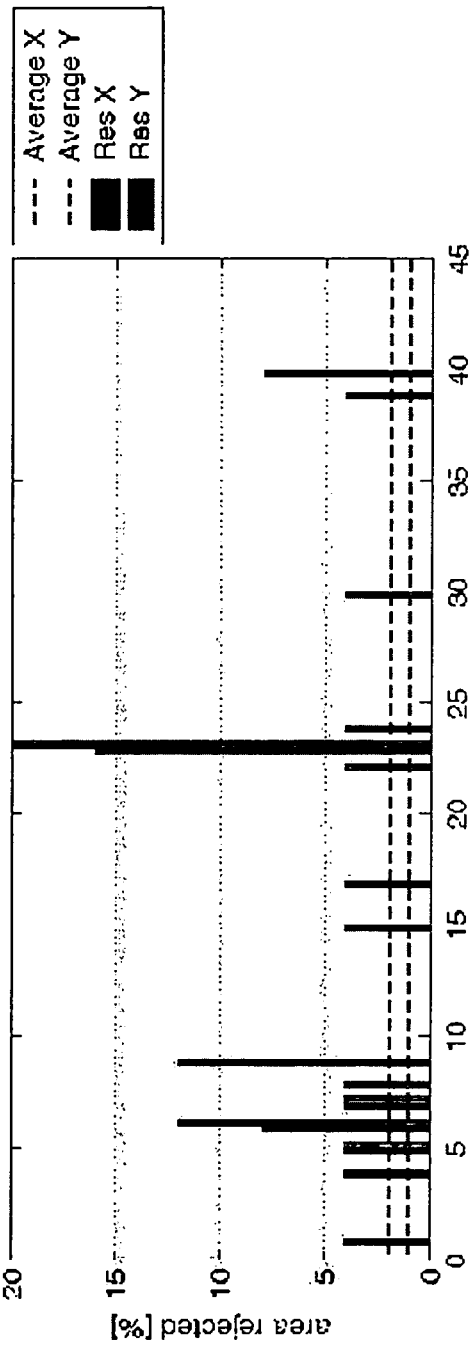
FIG. 7 illustrates the effect of two stages of measurement rejection in the example of FIG. 5.
Figure 7:
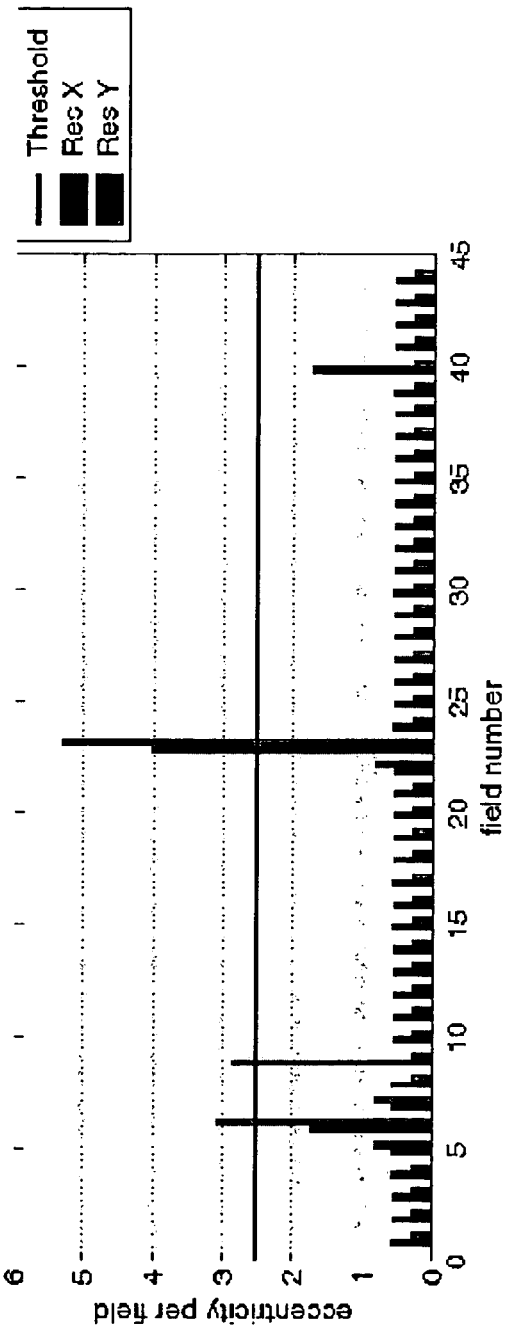

The upper part in FIG. 7 gives an overview of the data rejection per field (horizontal axis), in terms of area affected. For example, field 1 contains one measurement outlier in X, which represents 4% (1 out of 25 points) of the field qualification area. The rejected area of field 1 is said to be 4%. From this plot, we may quickly observe the extreme case of field 23 (ringed in FIG. 5), with 4 points (16%) and 5 points (20%) excluded in respectively X and Y.

The lower part of FIG. 7 represents the outcome of applying the field exclusion method, applying again Chauvenet's criterion, but now to assess the differences in rejection area from field to field. This graph includes Chauvenet's criterion (black line) based on n=44 fields. We see that fields 6, 9 and 23 must be excluded since their rejection areas are extremely large for either X, Y or both X and Y.

Table 3 and Table 4 show the effectiveness of both partial and whole field exclusion methods. Note that the original non-correctable fingerprint is already close to zero in this example, however both approaches give a reduction in the fingerprint and a significant reduction in the measurement noise, thereby increasing the confidence in the test result.

Figure 8:
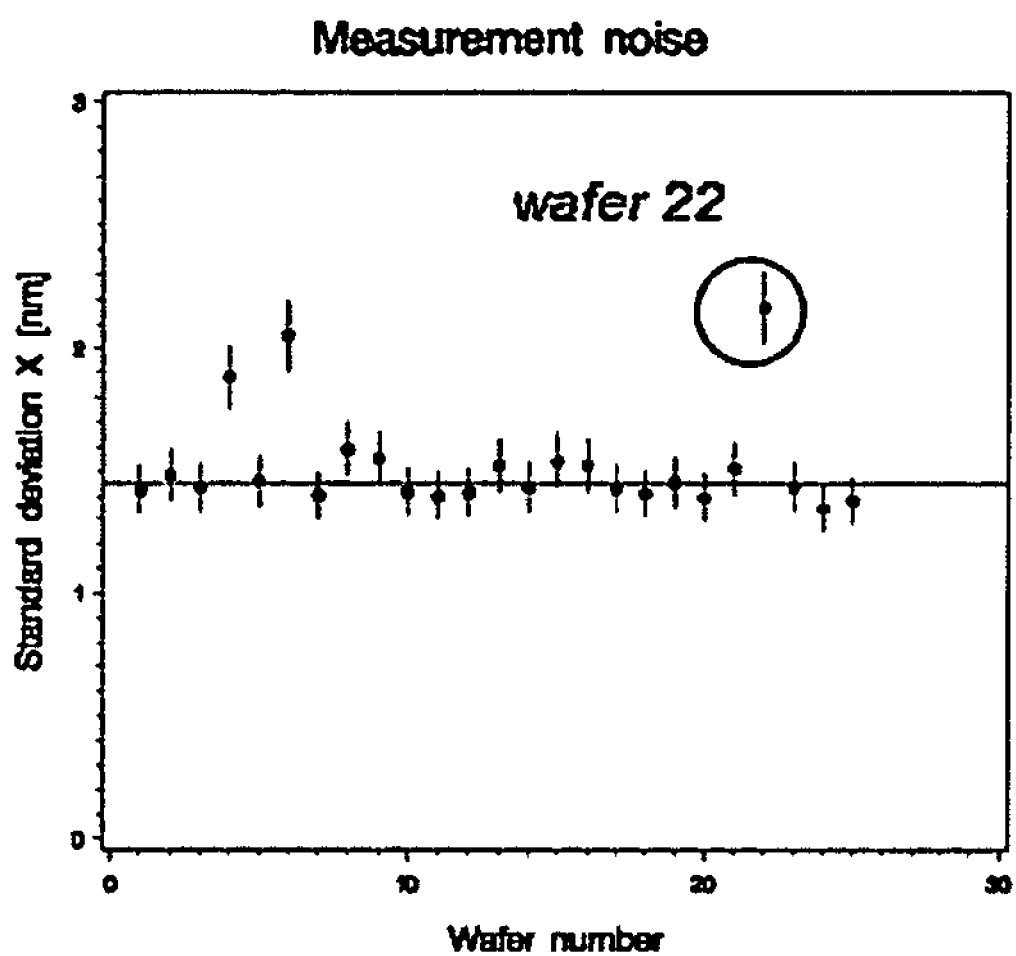
FIG. 8 illustrates the effect of measurement rejection in the data example of FIG. 5.

FIG. 8 shows measurement noise in X for the original batch of wafers, of which wafer 22 was picked for this analysis. The average noise level is indicated by the black line. Note that after rejecting the measurement outliers the noise level for wafer 22 closely approaches the average batch noise level. In other applications such as projection system qualification (non-correctable errors), machine calibration or verification (matching or leveling), or reference substrate qualification, a reduction of noise results in increased accuracy and better confidence levels in the estimation of model (calibration) parameters.

TABLE 3

Impact of both rejection methods on the calculated average non-correctable fingerprint, characterized by two parameters: |Max| and range.

| Average Fingerprint of Non-correctable errors | Original | Filtered Partial Field Exclusion* | Filtered Complete Field Exclusion** |
|---|---|---|---|
| X [nm] | | | |
| \|Max\| | 0.89 | 0.66 | 0.58 |
| Range | 1.74 | 1.05 | 0.98 |
| Y [nm] | | | |
| \|Max\| | 0.84 | 0.51 | 0.44 |
| Range | 1.48 | 0.85 | 0.76 |

*All points indicated in FIG. 6 are excluded
**Fields 6, 9 and 23 are excluded

TABLE 4

Impact of both rejection methods on the test quality, characterized by the estimated measurement noise.

| Estimated Measurement Noise | Original | Filtered Partial Field Exclusion* | Filtered Complete Field Exclusion** |
|---|---|---|---|
| X [nm] | | | |
| 1Sigma | 2.17 | 1.32 | 1.39 |
| Y [nm] | | | |
| 1Sigma | 2.07 | 1.33 | 1.36 |

*All points indicated in FIG. 6 are excluded
**Fields 6, 9 and 23 are excluded

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of calibrating a lithographic apparatus, the method comprising:
   measuring a value of a parameter indicative of the performance of the lithographic apparatus at a plurality of different positions, times and/or settings of the apparatus to generate a first data set comprising a plurality of measurement values;
   generating a second data set that is a subset of the first data set using a predetermined criteria to select data values of said first data set for inclusion in said second data set; and
   using a predetermined statistical process to derive a calibration value from the second data set.

2. A method according to claim 1 wherein the parameter comprises one of the overlay performance in one or more dimensions and the focus performance.

3. A method according to claim 1 wherein the plurality of measurements are taken at different positions spaced across the area of a substrate.

4. A method according to claim 1 wherein the plurality of measurements are taken using a plurality of different substrates.

5. A method according to claim 4 wherein the plurality of measurements include a plurality of measurements taken on each of said plurality of substrates.

6. A method according to claim 5 wherein the predetermined criterion is applied individually to select or reject each measurement of each substrate and then a second criterion is applied collectively to groups of measurements of each substrate to select or reject all measurements of that group.

7. A method according to claim 6 wherein the second predetermined criterion comprises comparison of the proportion of measurements of each group that have been rejected by the predetermined criterion to a threshold.

8. A method according to claim 6 wherein each of said groups comprises all measurements for a respective substrate.

9. A method according to claim 6 wherein each of said groups comprise all measurements for a field of a respective substrate.

10. A method according to claim 1 wherein the predetermined criterion is Chauvenet's criterion or Peirce's criterion.

11. A method according to claim 1 wherein the predetermined criterion is an absolute threshold.

12. A device manufacturing method using a lithographic apparatus arranged to transfer a pattern from a patterning device onto a substrate, the method comprising:
  calibrating the lithographic apparatus by:
    measuring a value of a parameter indicative of the performance of the lithographic apparatus at a plurality of different positions, times and/or settings of the apparatus to generate a first data set comprising a plurality of measurement values;
    generating a second data set that is a subset of the first data set using a predetermined criteria to select data values of said first data set for inclusion in said second data set; and
    using a predetermined statistical process to derive a calibration value from the second data set; and
  transferring a device pattern onto a second substrate using the calibration value to adjust a parameter of the apparatus.

13. A method of qualifying a part for a lithographic apparatus, the method comprising:
  measuring a value of a parameter indicative of a desired quality of the part at a plurality of different positions, and/or times to generate a first data set comprising a plurality of measurement values;
  generating a second data set that is a subset of the first data set using a predetermined criteria to select data values of said first data set for inclusion in said second data set; and
  using a predetermined statistical process to derive a qualification value from the second data set, whereby the fitness for use of the part can be judged on the basis of the qualification value.

14. A method according to claim 13 wherein the plurality of measurements are taken at different positions spaced across the area of a substrate.

15. A method according to claim 13 wherein the plurality of measurements are taken using a plurality of different substrates.

16. A method according to claim 15 wherein the plurality of measurements include a plurality of measurements taken on each of said plurality of substrates.

17. A method according to claim 16 wherein the predetermined criterion is applied individually to select or reject each measurement of each substrate and then a second criterion is applied collectively to groups of measurements of each substrate to select or reject all measurements of that group.

18. A method according to claim 17 wherein the second predetermined criterion comprises comparison of the proportion of measurements of each group that have been rejected by the predetermined criterion to a threshold.

19. A method according to claim 17 wherein each of said groups comprises all measurements for a respective substrate.

20. A method according to claim 17 wherein each of said groups comprise all measurements for a field of a respective substrate.

21. A method according to claim 13 wherein the predetermined criterion is Chauvenet's criterion or Peirce's criterion.

22. A method according to claim 13 wherein the predetermined criterion is an absolute threshold.

23. A method according to claim 13 wherein the part is a substrate holder and the parameter is the flatness of the substrate holder.

24. A method according to claim 13 wherein the part is a projection system and the parameter is non-correctable error.

25. A method according to claim 13 wherein the part is a reference substrate holder and the parameter is the flatness of the reference substrate.

* * * * *